United States Patent
Koga et al.

(10) Patent No.: US 6,690,030 B2
(45) Date of Patent: Feb. 10, 2004

(54) SEMICONDUCTOR DEVICE WITH NEGATIVE DIFFERENTIAL RESISTANCE CHARACTERISTICS

(75) Inventors: Junji Koga, Kanagawa-ken (JP); Ken Uchida, Kanagawa-ken (JP); Ryuji Ohba, Kanagawa-ken (JP); Akira Toriumi, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 296 days.

(21) Appl. No.: 09/798,923

(22) Filed: Mar. 6, 2001

(65) Prior Publication Data

US 2001/0019137 A1 Sep. 6, 2001

(30) Foreign Application Priority Data

Mar. 6, 2000 (JP) ........................................ 2000-060185

(51) Int. Cl.$^7$ .............................................. H01L 29/40
(52) U.S. Cl. ..................... 257/46; 257/104; 257/105; 257/106
(58) Field of Search ....................... 257/46, 104, 105, 257/106, 903, 904, E29.341, E27.098; 438/979, 983

(56) References Cited

U.S. PATENT DOCUMENTS

| 4,132,904 A | * | 1/1979 | Harari ......................... 307/238 |
| 4,573,143 A | | 2/1986 | Matsukawa ................. 365/175 |
| 5,032,891 A | * | 7/1991 | Takagi et al. ................ 257/350 |
| 5,349,206 A | * | 9/1994 | Kimura ........................ 257/67 |
| 5,936,265 A | | 8/1999 | Koga ........................... 257/105 |
| 6,133,093 A | * | 10/2000 | Prinz et al. .................. 438/257 |

* cited by examiner

Primary Examiner—Nathan J. Flynn
Assistant Examiner—Scott R Wilson
(74) Attorney, Agent, or Firm—Oblon, Spivak, McClelland, Maier & Neustadt, P.C.

(57) ABSTRACT

A gate oxide film formed on the surface of a silicon substrate is partly reduced in thickness or "thinned" at its specified part overlying a source region. In a gate region, a multilayer structure is formed which includes a first polycrystalline silicon or "polysilicon" film of a p-type conductivity, a tunnel oxide film, and a second p-type polysilicon film in this order of lamination. The source region and the first polysilicon film make up a high-concentration impurity-doped pn junction with a thin silicon oxide film laid therebetween, providing a tunnel diode also known as Esaki diode. The diode is used for a negative differential resistance. Further, a portion between the first and second polysilicon films is a non-linear tunnel resistor, which serves as a load. The negative differential resistance and the load are serially connected together between a low-voltage power supply (ground potential) Vss and a high-voltage power supply Vdd, thus enabling forming a transistor with a built-in bistable circuit. Potential information of the first polysilicon film for use as a data storage node is read with a transistor amplification applied thereto. Thus, data read is performed at high speeds. Simultaneously, a current flowing between the power supplies is suppressed to a lower level, thereby minimizing power consumption in wait modes.

20 Claims, 17 Drawing Sheets

SEMICONDUCTOR DEVICE WITH NEGATIVE DIFFERENTIAL RESISTANCE CHARACTERISTICS

CROSS-REFERENCE TO A RELATED APPLICATION

This application is related to Japanese Patent Application No. P2000-060185, filed on Mar. 6, 2000, the entire contents of which are incorporated.

BACKGROUND OF THE INVENTION

1. Field of the Invention

The present invention relates generally to semiconductor devices, and more particularly to functional devices utilizing negative differential resistance characteristics and also memory devices using load characteristics in addition thereto. The present invention also relates to a method of making the above-noted devices.

2. Discussion of the Background

To achieve higher performance and enhanced functionality of a silicon large-scale integration (LSI) circuit, static random access memory (SRAM) devices having an array of data storage cells with bistable characteristics have been proposed as memories suitable to achieve higher integration densities. Typically, the SRAM devices employ as their memory cells negative differential resistance such as Esaki diodes.

For example, FIG. 33 depicts an equivalent circuit configuration of one typical SRAM cell. This cell employs a negative differential resistance 100 and a load 101 operatively associated therewith.

In the SRAM cell shown in FIG. 33, a series combination of the load 101 and the negative differential resistance 100 is connected between a high-voltage power supply Vdd and a low-voltage power supply Vss. The load 101 and the negative differential resistance 100 are serially connected together at a circuit node (data storage node). A metal-oxide-semiconductor (MOS) transistor is inserted between the storage node and a corresponding bit line BL. The MOS transistor is used as a data transfer, conduction of which is controlled by a voltage applied to a corresponding word line WL coupled to an insulated gate of the MOS transistor.

An operation of the SRAM using the load 101 and the negative differential resistance 100 will now be explained with reference to FIG. 34. In more detail, FIG. 34 graphically shows voltage-versus-current characteristics at the storage node of a cell using Esaki diodes as the negative differential resistance 100 and the load 101, which are serially connected together in the forward-biased direction.

As shown in FIG. 34, one Esaki diode used as the load 101 exhibits a voltage-current curve D1. The remaining Esaki diode used as the negative differential resistance 100 shows a voltage-current curve D2. The curves D1, D2 have two stable points P0, P1. Information is stored so the stable points P0, P1 correspond to binary bit data. The states of these stable points P0, P1 will be read by the data-transfer MOS transistor.

Whereas traditional SRAM cells are designed so each cell requires four or six separate MOS transistors, the SRAM cell of FIG. 33 using the negative differential resistance 100 and the load 101 requires a decreased number of elements (i.e., a single transfer MOS transistor in addition to the load 101 and the negative differential resistance 100). This simple SRAM cell configuration makes it possible to reduce or "shrink" the memory cell occupation area on a chip (as taught from U.S. Pat. No. 4,573,143).

The SRAM with memory cells each using the load and negative differential resistance offers a demonstrable advantage over background SRAMs, because of the ability to attain higher on-chip integration. This can be said because the former is designable to employ highly miniaturized or more "compact" cells than ever before, as discussed previously.

Unfortunately, this advantage does not come without accompanying the following disadvantages. In more detail, it is difficult for the SRAM having the above-noted cell structure to satisfy the following conflicting requirements: low power consumption and high-speed operation performance. This "trade-off" problem occurs due to the necessity for reducing currents at the stable points to less than the order of magnitude of pico-amperes when attempting to lower electrical power consumed in wait modes, while on the contrary associating the need to increase such currents up to the order of magnitude of micro-amperes or more to achieve rapid charge-up/discharging of bit line capacitors when attempts are made to read storage information at high speeds.

Under the conflicting requirements, these current values exhibit an increased difference therebetween in excess of 6 orders of magnitude or greater. Simply controlling the high-voltage power supply cannot lead to successful achievement of both the power consumption reduction and the high-speed operability at the same time.

SUMMARY OF THE INVENTION

Accordingly, one object of the present invention is to solve the above-noted and other problems.

Another object of the present invention is to provide a novel semiconductor device, which employs a negative differential resistance and a load and which is capable of achieving both a low power consumption and a high-speed operability while at the same time offering increased on-chip integration densities.

To achieve these and other objects, the present invention provides in a first example a semiconductor device including a semiconductor substrate, a gate insulation film formed on the semiconductor substrate, a first conductive layer formed on the gate insulation film, a second conductive layer formed over the first conductive layer, and a channel region formed under the gate insulation film. Also included are spaced apart source and drain regions formed in the semiconductor substrate with the channel region placed therebetween, a load located between the first conductive layer and the second conductive layer, and a negative differential resistance located between the first conductive layer and the source region.

The present invention also provides in a second example a semiconductor device including a second conductive layer formed over the first conductive layer, and in which the negative differential resistance is located between the first conductive layer and the second conductive layer. Further, the load is located between the first conductive layer and the source region.

In yet another example, the present invention provides a semiconductor device including second and third conductive layers formed over the first conductive layer, and in which the negative differential resistance is located between the first conductive layer and the second conductive layer. Further, the load is located between the first conductive layer and the third conductive layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3A and 3B are diagrams for explaining an operation of the semiconductor device in accordance with the first aspect of the present invention, and in which FIG. 3A shows a configuration of equivalent circuitry including a series combination of a load and a negative differential resistance, and FIG. 3B is a graph showing the voltage-versus-current characteristics of the circuitry shown in FIG. 3A;

FIGS. 22A and 22B are diagrams for explanation of an operation of the semiconductor device in accordance with the sixth aspect of the present invention, and in which FIG. 22A shows an equivalent circuit including a series combination of a load and a negative differential resistance, and FIG. 22B is a graph showing the voltage-versus-current characteristics of the FIG. 22A circuit;

FIGS. 27A and 27B are diagrams for explanation of an operation of the semiconductor device in accordance with the tenth aspect of the present invention, and in which FIG. 27A shows an equivalent circuit including a series combination of a load and a negative differential resistance, and FIG. 22B is a graph showing an input voltage (Vin)-versus-output voltage (Vout) characteristic of the FIG. 27A circuit;

FIGS. 30A and 30B are diagrams for explaining an operation of the semiconductor device in accordance with the eleventh aspect of the present invention, and in which FIG. 30A shows an equivalent circuit comprising a series combination of a load and a negative differential resistance, and FIG. 30B is a graph showing a Vin-Vout characteristic of the FIG. 30A circuit;

DETAILED DESCRIPTION OF THE PREFERRED EMBODIMENTS

Figure 1:
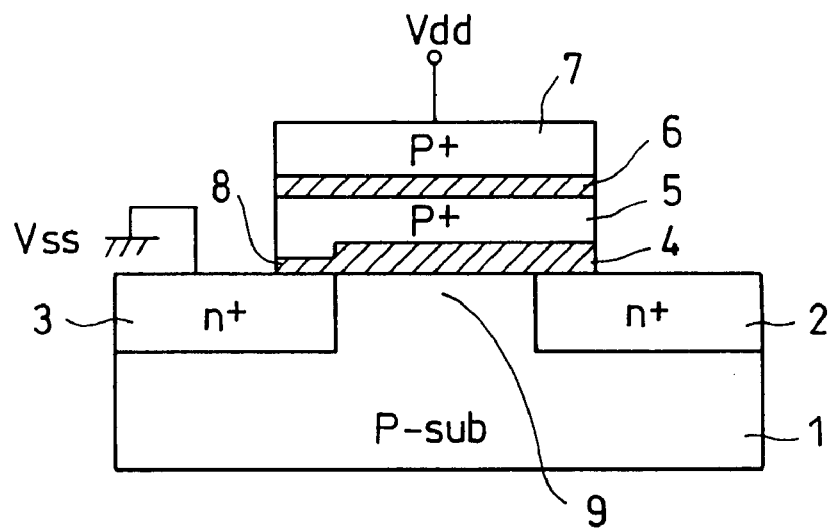
FIG. 1 is a diagram illustrating in cross-section a semiconductor device in accordance with a first aspect of the present invention.

Referring now to the drawings, wherein like reference numerals designate identical or corresponding parts throughout the several views, the present invention will be described.

Referring first to FIG. 1, there is shown a sectional view of a semiconductor device in accordance with the first aspect of the present invention. As shown in FIG. 1, the semiconductor device is formed on a semiconductor substrate 1 of a p-type conductivity. Further, the substrate 1 is made of silicon. The semiconductor device also has a gate insulation film 4 formed on a top surface of the substrate. The film 4 includes a silicon oxide with a thickness of about 5 nanometers (nm). The semiconductor device also has first and second conductive layers 5 and 7 insulatively stacked or laminated over each other. The first conductive layer 5 is made of a heavily-doped p (p$^+$) type polycrystalline silicon or "polysilicon" formed on the gate insulation film 4. The second conductive layer 7 is made of p$^+$-type and is formed overlying the first layer 5 with a silicon oxide film 6 interposed between them. Laterally spaced-apart is a source region 3 and a drain region 2 defined in the surface of substrate 1. The source region 3 and the drain region 2 are made of n+-type silicon, and also define a channel region 9 therebetween in the substrate 1. Further, the channel region 9 underlies the gate insulation film 4.

In addition, a tunneling dielectric layer 8 is formed between the n+-type source region 3 and its overlying part of the p$^+$-type first conductive layer 5. The tunnel dielectric layer 8 is formed of a silicon oxide film, and typically has a thickness of about 2 nm, which allows electrons to readily tunnel. With such a multilayer lamination structure including the n+-type source region 3 and the tunnel dielectric layer 8 plus the p+-type first conductive layer 5, a p-n junction with an increased impurity concentration is thus formed, which in turn forms an Esaki diode for use as a negative differential resistance.

The silicon oxide film 6 sandwiched between the first and the second p+-type conductive layers 5, 7 has a thickness of about 2 nm and is used as a tunnel dielectric layer. In addition, the three-layer lamination structure of the layers 5–7 exhibits nonlinear tunnel resistance characteristics and thus functions as a load.

Optionally, the second p+-type conductive layer 7 may be replaced with an n+-type layer, resulting in formation of a three-layer lamination structure including the p+-type first conductive layer 5, the tunnel dielectric layer 6 and the n+-type second conductive layer 7. This multilayer structure forms a pn junction with a high impurity concentration, thus permitting the load to be formed of an Esaki diode.

Alternatively, in the above structure, the tunnel dielectric layer 6 may be omitted if a double-layered structure of the p+-type first conductive layer 5 and the n+-type second conductive layer 7 is provided. This structure forms a pn junction with a high impurity concentration, thereby providing an Esaki diode for use as the load. Further, the tunnel dielectric film 6 is not interposed at an interface of the pn junction of the Esaki diode. In this case, a certain technique should be implemented to preclude a p-type semiconductor impurity and an n-type impurity from out-diffusing to each other.

In this structure, if the first conductive layer 5 is regarded as a gate electrode, then the n+-type source region 3 and the n+-type drain region 2 along with the gate insulation film 4 and a channel region 9 form a metal-oxide-semiconductor (MOS) transistor.

In addition, the source region 3 is connected to a low-voltage power supply Vss (ground potential), whereas the second conductive layer 7 is coupled to a high-voltage power supply Vdd. With such an arrangement, the first conductive layer 5 serving as a data storage node results in the formation of a bistable circuit.

Figure 2:
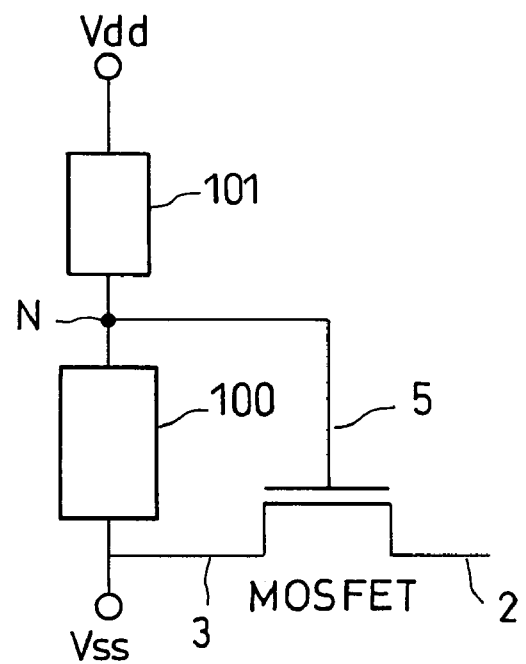
FIG. 2 is a diagram showing a configuration of an equivalent circuit of the semiconductor device in accordance with the first aspect of the present invention.

Referring next to FIG. 2, there is shown an equivalent circuit configuration of the semiconductor device of FIG. 1. As shown in FIG. 2, the semiconductor device includes a negative differential resistance 100 (an Esaki diode) and a load 101 (a nonlinear tunnel resistance). The negative differential resistance 100 is formed of the multilayer structure of the n+semiconductor 3, the tunnel dielectric layer 8, and the p+ type first conductive layer 5. The load 101 includes a lamination of the p+ type first conductive layer 5, the tunnel dielectric layer 6, and the p+ type second conductive layer 7. The negative differential resistance 100 and the load 101 are serially connected together at a connection node N (the first conductive layer 5). The node N is used as a storage node, to which the gate electrode (the first conductive layer 5) of the above-stated MOS transistor is connected. Further, the source region 3 of the transistor is connected to an electrode of the negative differential resistance 100, which is coupled to the low-voltage power supply Vss. The MOS transistor's source region 3 and the negative differential resistance 100's semiconductor 3 are a single common-use part and the MOS transistor's gate 5 and the resistor 100's semiconductor 5 are a common part. Similarly, the load 101's p+ semiconductor and the MOS transistor gate 5 are also a common part.

A detailed explanation of an operation principle of the semiconductor device with reference to FIGS. 3A–3B and 4 will now be given.

Figure 3:
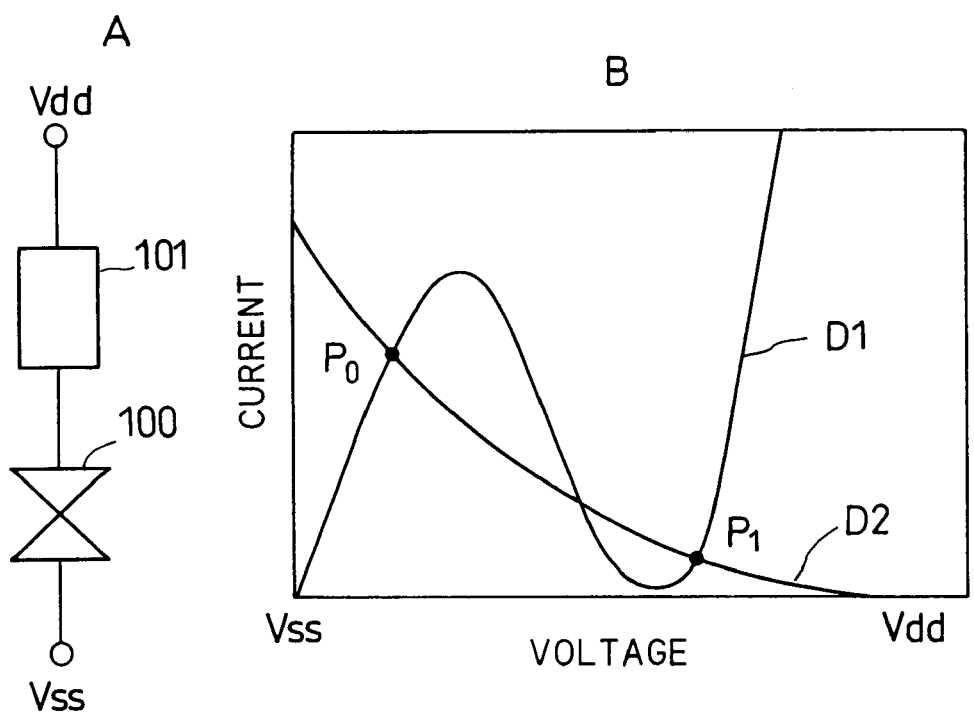

FIG. 3A shows an equivalent circuit of a series combination of the load 101 and the negative differential resistance 100 (an Esaki diode), and FIG. 3B is a graph showing a voltage-versus-current curve D1 of the Esaki diode 100 with the three-layer lamination structure including the n+-type source region 3, the tunnel dielectric layer 8, and the p+-type first conductive layer 5. This graph also shows a voltage-current curve D2 of the nonlinear tunnel load resistor 101 with the three-layer lamination of the p+-type first conductive layer 5, the tunnel dielectric layer 6, and the p+-type second conductive layer 7.

As shown in FIG. 3B, the current-voltage curves D1 and D2 have cross points, which take two statically stable values P0, P1, thus enabling storage of information.

Figure 4:
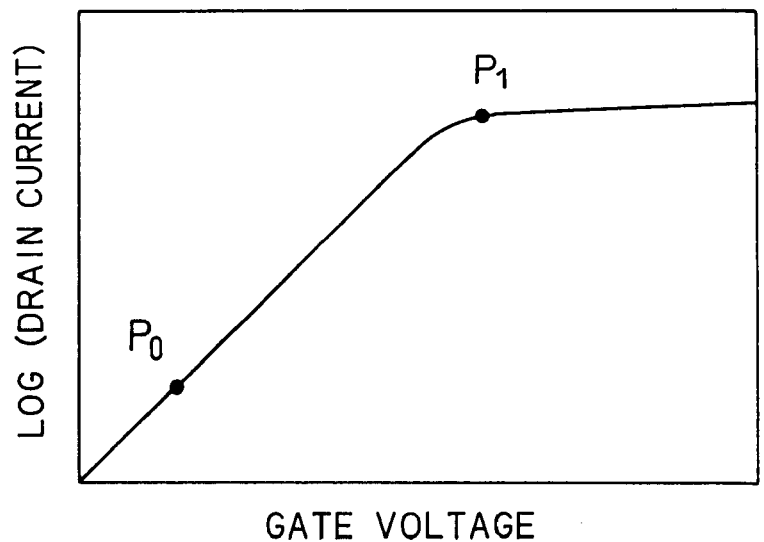
FIG. 4 is a graph showing a gate voltage versus a drain current characteristic of the semiconductor device in accordance with the first aspect of the present invention, for explaining an operation thereof.

Turning now to FIG. 4, which is a graph showing a gate-voltage/drain-current characteristic of a MOS transistor having its gate formed of the first conductive layer 5 used as the storage node, a source formed of the n+-type source region 3, and a drain of the n+-type drain region 2.

In addition, to minimize power consumption in wait modes, the current values at the two stable points P0, P1 is set in the order of magnitude of pico-amperes. As shown in FIG. 4, the transistor turns on when its gate voltage is at the point P1, causing a flow of current of the order of magnitude of micro-amperes or greater. On the contrary, when the gate voltage potentially drops to or below point P0, the transistor turns off, which causes currents to not flow therein.

With the above-noted settings, it is possible to greatly reduce or minimize power consumption during wait modes, while at the same time achieving high-speed operability by use of the amplifying effect of such a MOS transistor.

Another advantage of the present invention is the ability to fabricate the load on or over the gate insulation film 4 of the amplifying MOS transistor as shown in FIG. 1. It is also possible to microfabricate the intended negative differential resistance at terminate end portions or "edges" of the source region 3 and the gate insulation film 4. This also makes it possible to simultaneously accomplish a higher integration of the circuitry.

With the above setup, a technique for optimizing an impurity profile of the p-type silicon substrate 1 is needed to ensure that the MOS transistor's threshold voltage is midway in value between the stable points P0, P1.

Figure 5:
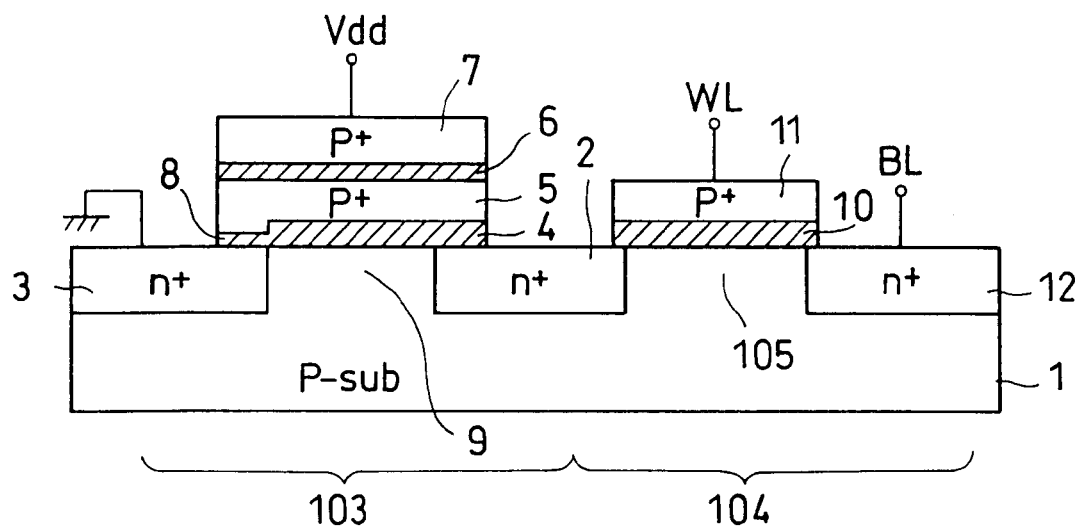
FIG. 5 is a diagram depicting in cross-section a semiconductor device in accordance with the first aspect of the present invention.

Turning now to FIG. 5, there is shown a sectional view of a static random access memory (SRAM) cell, which includes a semiconductor device 103 of FIG. 1 and a data transfer transistor 104 operatively coupled thereto. This SRAM cell has an equivalent circuit to that shown in FIG. 6.

The SRAM cell of FIG. 5 is structured from the semiconductor device 103 and the transistor 104 formed side-by-side on the p-type silicon substrate 1. The semiconductor device 103 on the left side is similar in structure to that shown in FIG. 1. Further, the MOS transistor 104 on the right side has a channel region 105 defined between the laterally spaced-apart source region 2 and a drain region 12 in the substrate 1. The MOS transistor 104 also has its gate electrode 11 insulatively overlying the channel region 105 with a gate oxide film 10 sandwiched therebetween.

Figure 6:
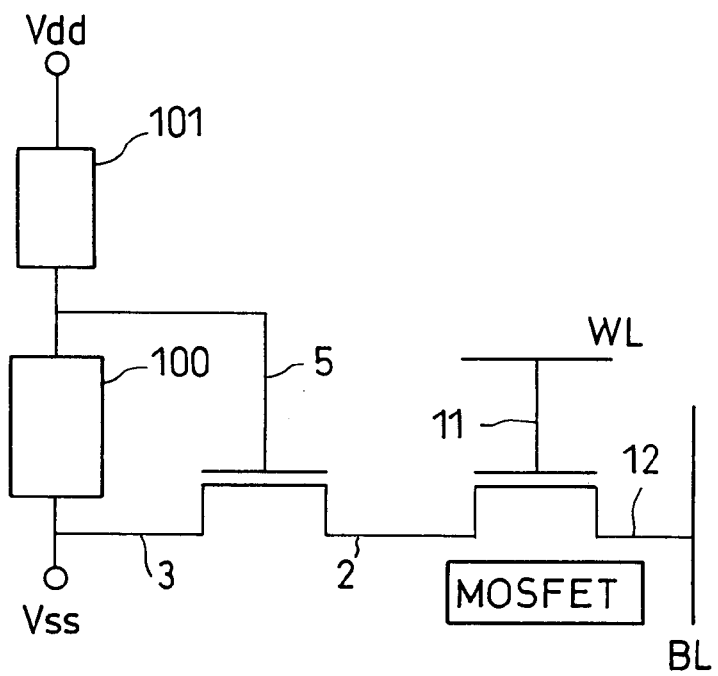
FIG. 6 is a diagram showing an equivalent circuit of the semiconductor device in accordance with the first aspect of the present invention.

As shown in FIGS. 5–6, the source region 2 of the data-transfer MOS transistor 104 is connected to the drain region 2 of the data-storage semiconductor device 103 on the left side in FIG. 5. Because the data-storage semiconductor device 103's drain region 2 and the data-transfer MOS transistor 104's source region 2 are formed of a single common n'-type silicon region 2, it is possible to reduce an on-chip cell fabrication area. In addition, the data-transfer MOS transistor 104 has its gate electrode 11 made of a p+-type polysilicon, which is formed on the gate oxide film 10. The gate electrode 11 is also connected to a corresponding word line WL. Further, the n+-type drain region 12 of the data-transfer MOS transistor 104 is electrically coupled to a corresponding bit line BL.

The SRAM cell with the transistor structure shown in FIG. 5 is advantageous because the resulting on-chip area is minimized. This can be said because the fabrication of this cell merely requires a reduced chip area corresponding to only two elements (i.e., the data-storage semiconductor device 103 and the data-transfer MOS transistor 104).

Figure 7:
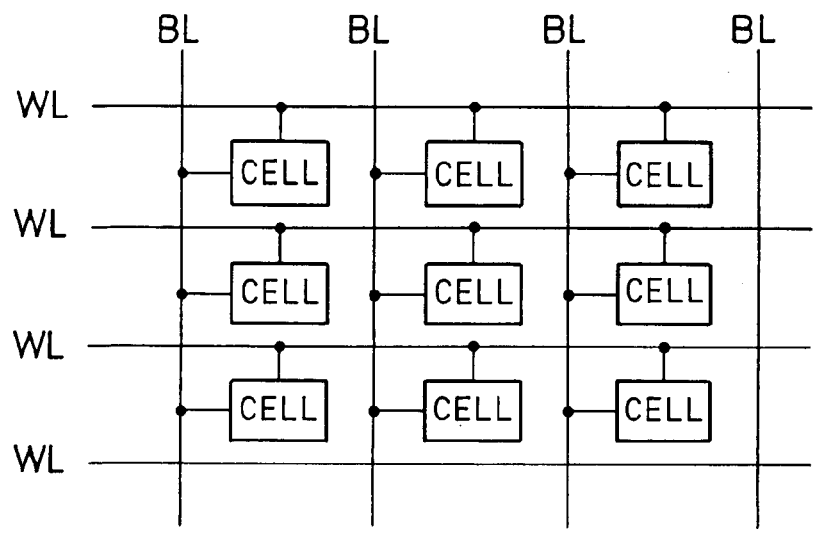
FIG. 7 is a diagram pictorially showing a configuration of a matrix array of memory cells each employing the semiconductor device in accordance with the first aspect of the present invention.

Turning now to FIG. 7, which is a pictorial representation of a matrix array of memory cells of a semiconductor memory device including the SRAM cell discussed above.

As shown in FIG. 7, the memory device includes rows of parallel word lines WL and columns of parallel bit lines BL. The word lines WL and the bit lines BL insulatively cross over each other, and thus form a lattice-like pattern. The word and bit lines WL, BL have a matrix of crossover points or "intersections," each of which is associated with a corresponding one of the SRAM cells. In other words, each word line WL is associated with a row of memory cells whereas each bit line BL is associated with a column of cells.

Further, each cell is formed of the device shown in FIG. 5, and includes the data-storage semiconductor device 103 on the left side and the date-transfer MOS transistor 104 on the right side. In addition, in FIG. 5, the data-transfer MOS transistor 104 is connected at its gate 10 to a word line and the n+-type drain region 12 is coupled to a bit line BL. Further, the SRAM device of FIG. 7 also includes Vdd/Vss power supply lines, which are omitted in FIG. 7 for illustration purposes only.

In addition, as previously discussed, it is possible to save the memory cells' on-chip occupation area. Thus, the SRAM device is excellent in a high integration density attainability, which permits accomplishment of highly integrated memory chips with increased data storageabilities of 1 giga-bit or more.

Figure 35:
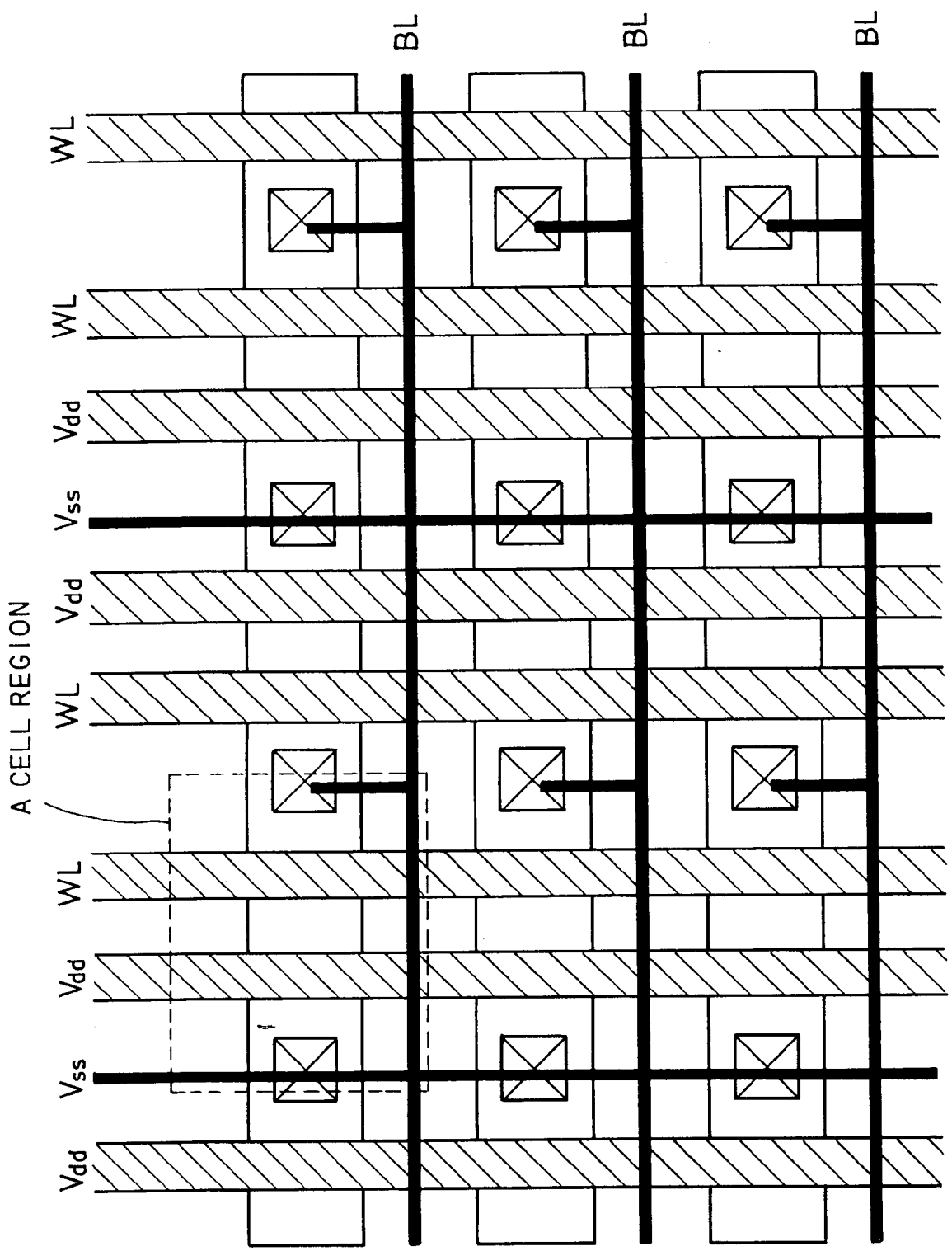
FIG. 35 is a pictorial representation of the layout of a matrix array of memory cells each using the semiconductor device in accordance with the first aspect of the present invention.

Turning now to FIG. 35, which depicts a design layout pattern of the memory cell array of the semiconductor memory device shown in FIG. 7. For the purpose of a common use or "commonization" of neighboring Vss power supply lines and bit lines BL, adjacent SRAM cells are in the relation of an inverted symmetry. Additionally, the Vss power supply lines are parallel metallic wiring leads that extend in an up-down direction on the sheet of the drawing (e.g., in a "column" direction). The bit lines BL are metal leads that extend laterally, (e.g., in a "row" direction). Further, the Vdd power supply lines and word lines WL are such that each extends in the column direction and is commonly used by the upper and lower cells. The illustrative lead layout is achievable by use of multilayer wiring technologies.

Further, as shown in FIG. 35, an on-chip occupation area per memory cell is a region surrounded by dotted lines. As apparent from this diagram, the individual SRAM cell is realizable with a reduced chip area almost equivalent to that of a single transistor, and thus a higher integration is obtainable.

A manufacturing method of the semiconductor device of the first aspect of the present invention will now be discussed with reference to FIGS. 8 to 10.

Figure 8:
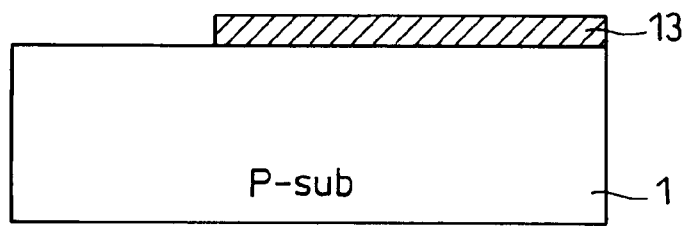
FIGS. 8 to 10 are diagrams illustrating in cross-section some of the major steps of one exemplary manufacturing process of the semiconductor device in accordance with the first aspect of the present invention.

First, as shown in FIG. 8, a p-type silicon substrate 1 is prepared. A silicon oxide film 13 is also formed on a surface of the p-type silicon substrate 1 to a predetermined thickness, for example, 4 nm. Thereafter, the substrate 1 is photo lithographically etched causing it to be exposed at a selected part thereof.

Figure 9:
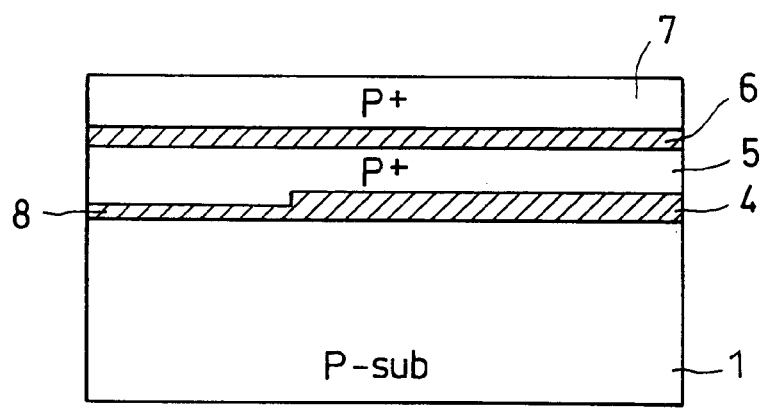

Then, as shown in FIG. 9, thermal oxidation is applied to the resultant structure, thereby forming a silicon oxide film on the exposed surface portion of the p-type silicon substrate 1 to a thickness of about 2 nm. A portion where the silicon oxide film 13 is present is inherently less in an oxidation amount. Thus, a silicon oxide film 4 is fabricated with a total thickness of about 5 nm, while a silicon oxide film 8 is formed at the exposed part to a thickness of about 2 nm.

Next, a polysilicon film 5 containing a heavily-doped boron impurity is deposited on the resulting structure to a thickness of about 200 nm. This film is then subjected to thermal oxidation, thus forming on the polysilicon film 5 a silicon oxide film 6 to a thickness of about 2 nm. Deposition is again performed to form a polysilicon film 7 containing a heavily-doped boron impurity to a thickness of about 200 nm.

Figure 10:
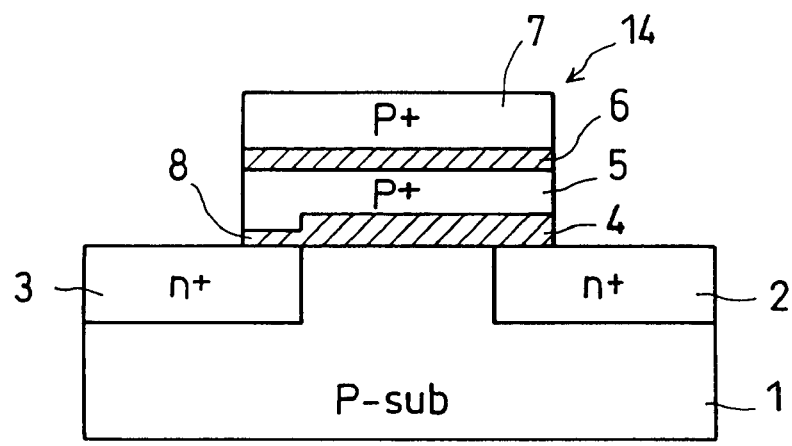

Next, as shown in FIG. 10, the device structure of FIG. 9 is photolithographically patterned by anisotropic etch techniques such as reactive ion etching (RIE), thereby forming a multilayered gate unit 14. With the gate unit 14 used as a mask, a chosen impurity (e.g., arsenic) is doped by ion-implantation into the silicon substrate 1, thus forming the source region 3 and the drain region 2 (which are laterally spaced apart) in the surface of substrate 1. To form an overlap region of the source region 3 and the multilayer gate 14, angled or "oblique" ion implantation techniques are effective.

Through the above process steps, the semiconductor device of the first aspect is manufacturable.

Another manufacturing method of this semiconductor device is available, as will be explained with reference to FIGS. 11–13.

Figure 11:
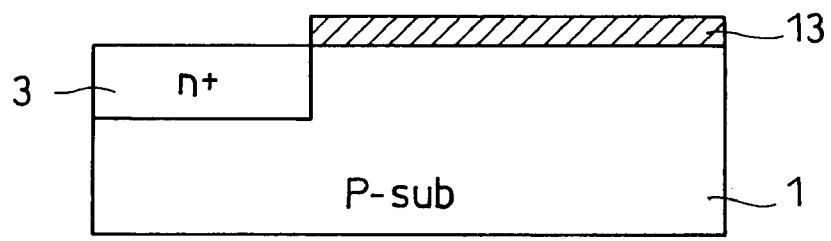
FIGS. 11–13 are diagrams illustrating in cross-section some major steps of another manufacturing process of the semiconductor device in accordance with the first aspect of the present invention.

First, as shown in FIG. 11, a silicon oxide film 13 is fabricated on the top surface of a p-type silicon substrate 1 to a thickness of about 4 nm. Thereafter, arsenic is ion-implanted into the substrate 1 with a photolithographically patterned resist film being used as a mask, thus forming a source region 3. Then, part of the silicon oxide film 13 is selectively removed, causing a corresponding exposed portion of the substrate 1 to be exposed.

Figure 12:
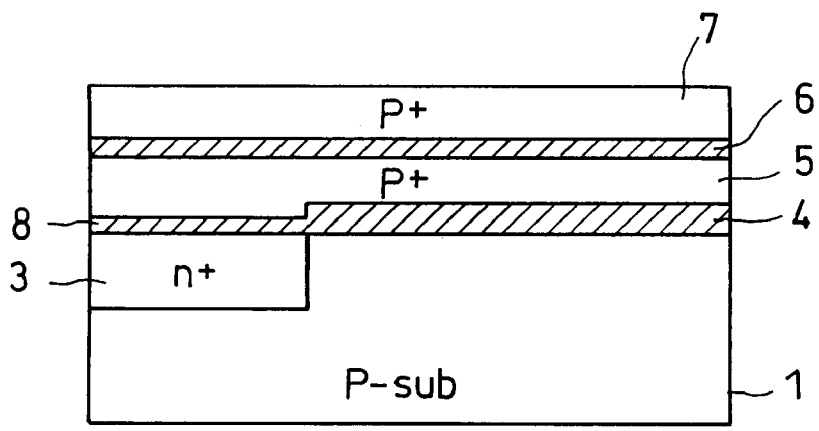

Then, as shown in FIG. 12, thermal oxidation is performed, which forms on the exposed surface of silicon substrate 1 a silicon oxide film 13, typically about 2 nm thick. Further, a portion where the silicon oxide film 13 exists is inherently less in an oxidation amount. Thus, a silicon oxide film 4 is fabricated with a total thickness of about 5 nm, while a silicon oxide film 8 is formed at the exposed part to a thickness of about 2 nm.

Next, a polysilicon film 5 containing a heavily-doped boron impurity is deposited on the resulting structure to a thickness of about 200 nm. This film is then subject to thermal oxidation so as to form on the polysilicon film 5 a silicon oxide film 6 to a thickness of about 2 nm. Deposition is again performed to thereby form a polysilicon film 7 containing a heavily-doped boron impurity to a thickness of about 200 nm.

Figure 13:
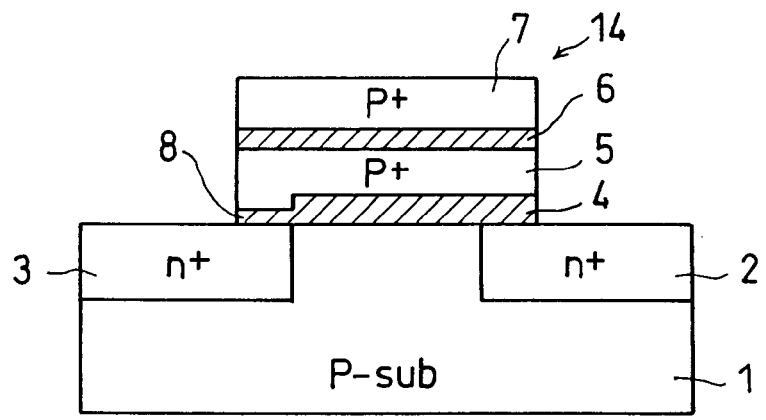

Next, as shown in FIG. 13, the structure of FIG. 12 is photolithographically patterned by anisotropic etch techniques, thereby forming the intended multilayer gate 14. In addition, the arsenic ion implantation is continuously performed to thereby form the drain region 2. Formation of the overlap region of source 3 and gate 14 in this way is also effective.

Figure 14:
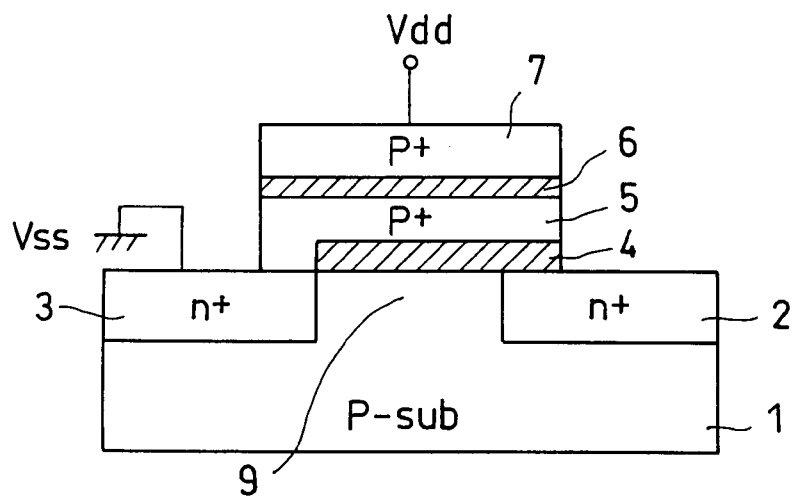
FIG. 14 depicts a sectional view of a semiconductor device in accordance with a second aspect of the present invention.

Turning now to FIG. 14, there is shown in sectional form a semiconductor device in accordance with a second aspect of the present invention.

In more detail, the device is arranged so that the n+-type source region 3 and the p$^+$-type first conductive layer 5 are in direct contact with each other at the edge portion of gate insulation film 4, resulting in formation of an Esaki diode for use as the negative differential resistance. The remaining part of the device of FIG. 14 is similar in structure to that of the first aspect stated supra. Like components are designated by like reference numerals, and an explanation thereof is accordingly eliminated.

A novel structural feature of the device in FIG. 14 is that the tunnel dielectric film is absent at the interface of the pn junction of the Esaki diode. Lack of such a tunnel dielectric film at the pn junction permits omission of the oxidation process for fabricating the tunnel dielectric film 8 of the semiconductor device of the first aspect. This leads to reducing manufacturing costs, although, certain techniques are required for appropriately controlling the diffusion of impurities doped. One example of the impurity diffusion control techniques is to optimize the process conditions during regrowth of the polysilicon of the first conductive layer 5 to thereby suppress mutual out-diffusion of the impurities doped.

Obviously, the semiconductor device structure of FIG. 14 may also be used to form the SRAM shown in any one of the FIGS. 5–7.

A manufacturing method of the semiconductor device of the second aspect will now be discussed with reference to FIGS. 15–17.

Figure 15:
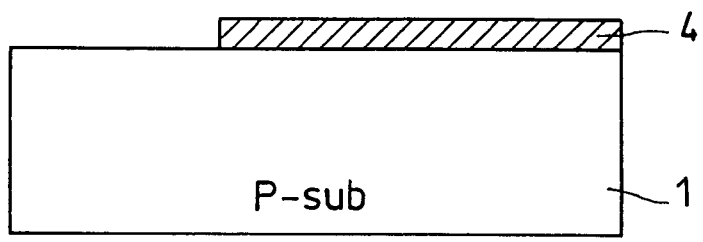
FIGS. 15–17 are diagrams depicting in cross-section some of the major process steps in the manufacture of the semiconductor device in accordance with the second aspect of the present invention.

First, as shown in FIG. 15, a p-type silicon substrate 1 is prepared and a silicon oxide film 4 is formed on the surface of the p-type silicon substrate 1 to a predetermined thickness of about 5 nm. Thereafter, the substrate 1 is photolithographically etched, thereby partially exposing the substrate 1.

Figure 16:
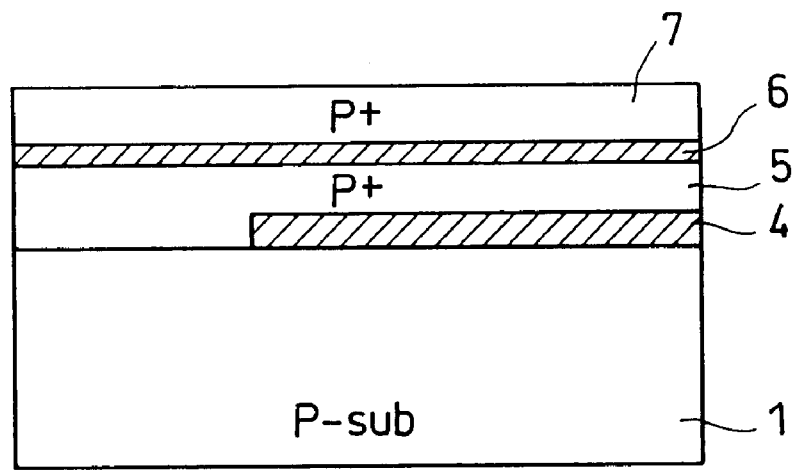

Then, as shown in FIG. 16, a polysilicon film 5 containing a heavily-doped boron impurity is deposited to a thickness of about 200 nm. The polysilicon film 5 is then subject to thermal oxidation, thus forming a silicon oxide film 6 to a thickness of about 2 nm on the film surface. Deposition is again performed so as to form a polysilicon film 7 containing a heavily-doped boron impurity to a thickness of about 200 nm.

Figure 17:
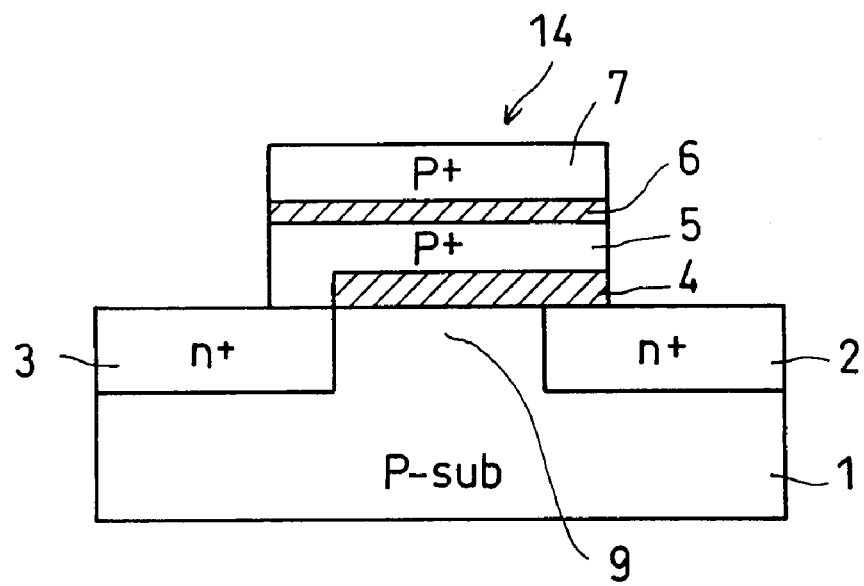

Next, as shown in FIG. 17, the resulting structure is photolithographically patterned by anisotropic etching to thereby form a multilayered gate unit 14. With the gate unit 14 as a mask, an arsenic impurity is ion-implanted into the silicon substrate 1, thus forming the source region 3 and the drain region 2 (which are spaced apart) in the silicon substrate 1. One preferable approach to forming an overlap region of the source region 3 and the gate 14 is to use oblique ion implantation techniques.

Figure 18:
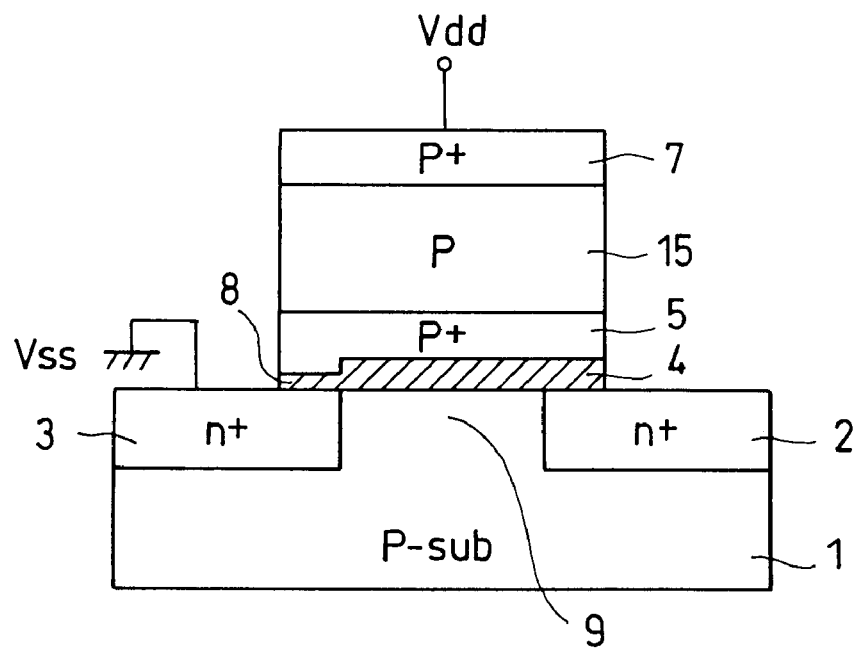
FIGS. 18–21 are sectional views of semiconductor devices in accordance with a third through sixth aspect of the present invention, respectively.

Turning now to FIG. 18, which is a diagram showing a cross-section of a semiconductor device in accordance with a third aspect of the present invention.

The illustrative device is similar to that of the first aspect discussed previously, and includes a semiconductor layer 15 formed as a resistor between the p$^+$-type first conductive layer 5 and the p$^+$-type second conductive layer 7. This additional layer 15 is formed of a lightly-doped p (p–) type polysilicon film. The resulting load has its resistance value determinable by that of the p-type layer 15.

With the device shown in FIG. 18, it is possible to continuously perform crystal growth processes of the polysilicon layer 15 and the second conductive layer 7 which overlie the first conductive layer 5. This makes it possible to reduce the number of process steps to manufacture the device.

Obviously, the device in FIG. 18 may also be used to form the SRAM shown in FIG. 5, 6 or 7.

Figure 19:
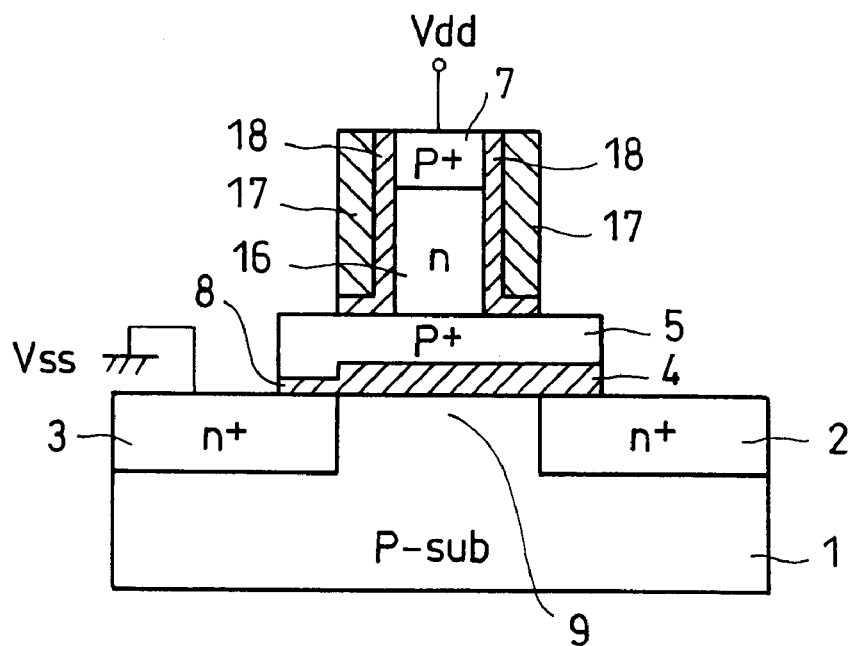

A semiconductor device in accordance with a fourth aspect of the present invention is depicted in cross-section in FIG. 19. This device is similar in structure to that of the first aspect, except that its load is formed of a vertical-type MOS transistor for forming the bistable circuit. More specifically, a semiconductor layer 16 is formed between the p$^+$-type first conductive layer 5 and the p$^+$-type second conductive layer 7. Further, the layer 16 is made of an n-type polysilicon. An insulated control gate 17 is also formed over sidewalls of the n-type polysilicon layer 16 and the p$^+$-type second conductive layer 7, with a gate insulation film 18 laid therebetween. The control gate 17 is made of an n+-type polysilicon, whereas the gate insulation film 18 is made of a silicon oxide.

An advantage of the device shown in FIG. 18 is its ability to permit the control gate 17 to adequately control or adjust a current flowing in the vertical-type MOS transistor serving as the load. In other words, this example advantageously offers enhanced controllability of an operation of the bistable circuit, which is a novel concept of the present invention. This in turn makes it possible to achieve increased memory function tunabilities.

Obviously, the device shown in FIG. 19 may also be used to form the SRAM shown in FIG. 5, 6 or 7.

Figure 20:
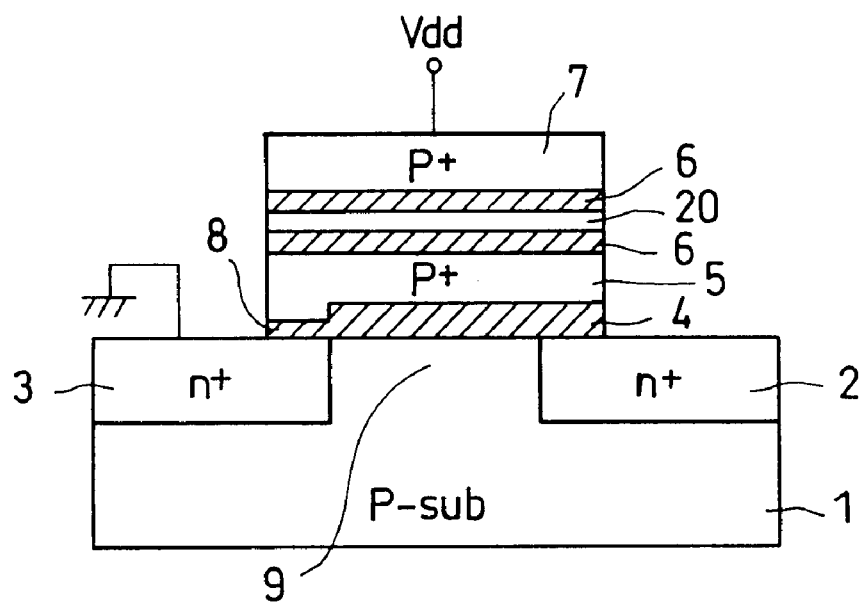

Turning now to FIG. 20, which illustrates a semiconductor device in accordance with a fifth aspect of the present invention. In this aspect, a multilayer lamination structure is interposed between the p$^+$-type first conductive layer 5 and the p$^+$-type second conductive layer 7. The lamination structure includes a tunnel dielectric film 6, a semiconductor layer 20, and another tunnel dielectric film 6. This three-layer lamination forms a resonant tunnel diode which is used as a load, resulting in forming the intended bistable circuit.

Typically, the tunnel dielectric films 6 forming the resonant tunnel diode are each formed of about a 2-nm thick silicon oxide film, which permits electrons to readily tunnel. The semiconductor layer 20 is preferably made of a non-doped silicon or silicon germanium and is made thinner to measure about 4 nm or less in thickness, for example. Optionally, the dielectric-film/semiconductor-layer lamination structure may include an increased number of insulated semiconductor layers, each of which is sandwiched between its overlying and underlying dielectric films. With such an arrangement, similar results as discussed above are also obtainable.

Obviously, the device shown in FIG. 20 may also be used to form the SRAM shown in FIG. 5, 6 or 7. Further, in the device of FIG. 20, the resonant tunnel diode is used as the required negative differential resistance. When the need arises, the source region 3 may be modified to have a p$^+$ type rather than an n+type, thereby providing a multilayer structure including a p$^+$-type source 3 and the tunnel dielectric film 8 plus the p$^+$-type first conductive layer 5 for use as a load that exhibits nonlinear tunnel resistance characteristics. At this time, the drain region 2 is also designed to have a p$^+$ type. Respective components are interchangeable between p and n conductivity types.

Figure 21:
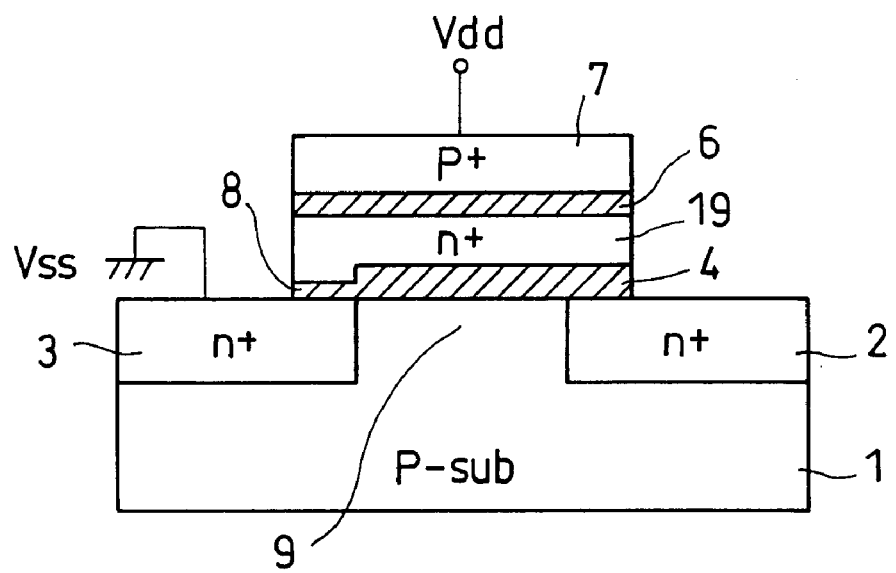

A semiconductor device in accordance with a sixth aspect of the present invention is shown in cross-section in FIG. 21.

The semiconductor device is structured from a p-type semiconductor substrate 1 made of silicon, and spaced-apart n+-type silicon source and drain regions 3, 2 are formed in the surface of substrate 1 with a channel region 9 defined therebetween. A multilayer gate structure is insulatively formed over the substrate surface so that it overlies the channel region 9 and opposing inside edges of the source/drain regions 3, 2. The gate structure includes an n+type first conducive layer 19 and a p+ type second conductive layer 7. The first and second conductive layers 19 and 7 are made of polysilicons of the opposite conductivity types (i.e., n+ and p+ types, respectively). The first conductive layer 19 substantially overlies the channel region 9 with a gate insulation film 4 sandwiched therebetween. The second conductive layer 7 is over the first layer 19 with an interlayer dielectric film 6 laid therebetween.

Further, a tunnel dielectric layer 8 is formed between the n+-type source region 3 and its overlying portion of the n+-type first conductive layer 19. In addition, the tunnel dielectric layer 8 is formed of a silicon oxide film and is typically about 2-nm thick. This thickness facilitates tunneling of electrons. Further, the multilayer structure including the n+-type source region 3 and n+-type first conductive layer 19 with the tunnel dielectric layer 8 sandwiched therebetween makes up a load having nonlinear tunnel resistance characteristics.

The interlayer dielectric film 6 between the n+-type first conductive layer 19 and the p+-type second conductive layer 7 is a silicon oxide film with a thickness of about 2 nm. This film is for use as a tunnel dielectric layer. In addition, the multilayer structure including the n+-type first conductive layer 19 and the p+-type second conductive layer 7 with the tunnel dielectric layer 6 laid therebetween forms a pn junction with an increased impurity concentration, which in turn makes up an Esaki diode for use as the negative differential resistance.

With the first conductive layer 19 being regarded as a gate electrode, an ensemble of the n+-type source region 3 and the n+-type drain region 2 along with the gate insulation film 4 and the channel region 9 forms a MOS transistor.

Additionally, the source region 3 is connected to the low-voltage power supply Vss (ground potential), whereas the second conductive layer 7 is coupled to the high-voltage power supply Vdd.

With such an arrangement, using the first conductive layer 19 as a storage node results in forming a bistable circuit.

Figure 22:
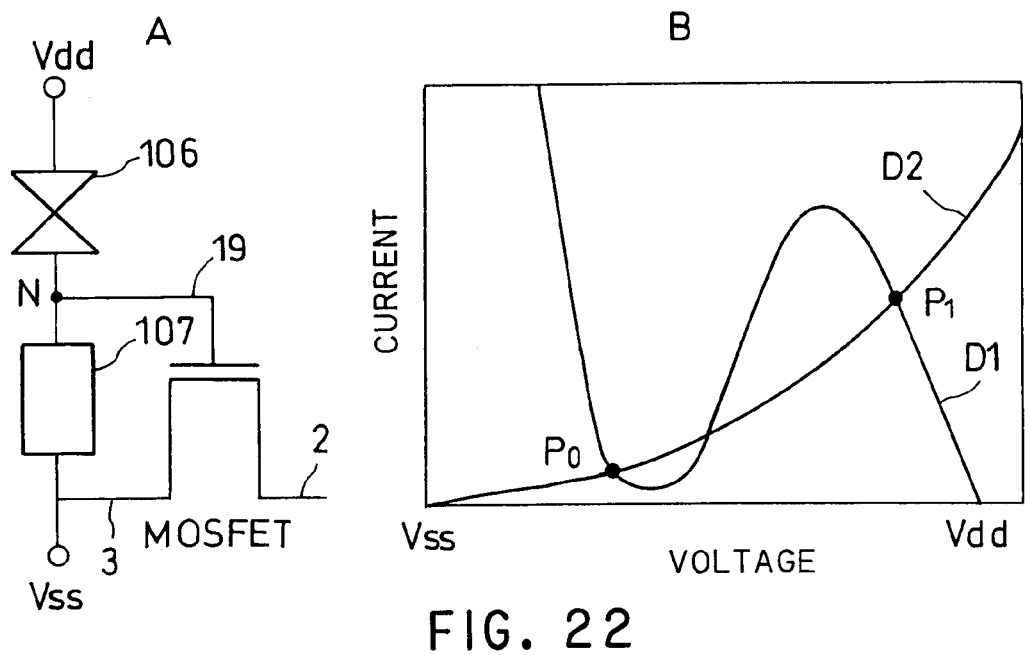

An equivalent circuit of the device shown in FIG. 21 is shown in FIG. 22A. As shown, a negative differential resistance 106 (i.e., an Esaki diode) and a load 107 (a nonlinear tunnel resistor) are serially connected together at a node N used as the storage node (a first conductive layer 19), to which the above-noted MOS transistor's gate electrode (the first conductive layer 19) is connected. The source region 3 of this transistor is connected to a low-voltage power supply Vss terminal of the load 107.

Further, the graph in FIG. 22B shows a voltage-current curve D1 of the Esaki diode 106 used as the negative differential resistance along with a curve D2 of the nonlinear tunnel resistor 107 acting as the load. Again, the Esaki diode 106 is made up from the n+-type first conductive layer 19, the tunnel dielectric layer 6, and the p+-type second conductive layer 7.

The tunnel resistor 107 is formed of the n+-type first conductive layer 19 and the n+-type source region 3 with the tunnel dielectric layer 8 sandwiched between them.

As apparent from FIG. 22B, the voltage-current curves D1, D2 cross each other at three points, including two "stable" points P0, P1 having statically stable values. Using the stable points P0, P1 permits storage of information.

Additionally, adequate settings are made to allow the MOS transistor to have the characteristics shown in FIG. 4.

Next, to significantly reduce or minimize power consumption in wait modes, the current values at the two stable points P0, P1 are set at the order of magnitude of picoamperes. In a similar way to that of FIG. 4, the transistor turns on when its gate voltage is at the point P1, causing flow of a current of the order of magnitude of micro-amperes or greater. On the other hand, when the gate voltage potentially drops to or below point P0, the transistor turns off which causes currents to not flow.

With the above settings, it is possible to minimize power consumption during wait modes, while simultaneously achieving high-speed operability by use of the amplifying effect of such a MOS transistor.

Another advantage of the present invention is the ability to form the negative differential resistance on or over the gate insulation film 4 of the amplifying MOS transistor as shown in FIG. 21. This makes it possible to microfabricate the intended load at edge portions of the source region 3 and the gate insulation film 4. Thus, it is also possible to accomplish a higher integration of the circuitry involved.

For the above setup, a certain technique for optimizing an impurity profile of the p-type silicon substrate 1 is needed to ensure that the MOS transistor's threshold voltage value is midway between the stable points P0, P1.

Obviously the device of FIG. 21 may also be employed to form the SRAM shown in FIG. 5, 6 or 7.

Figure 23:
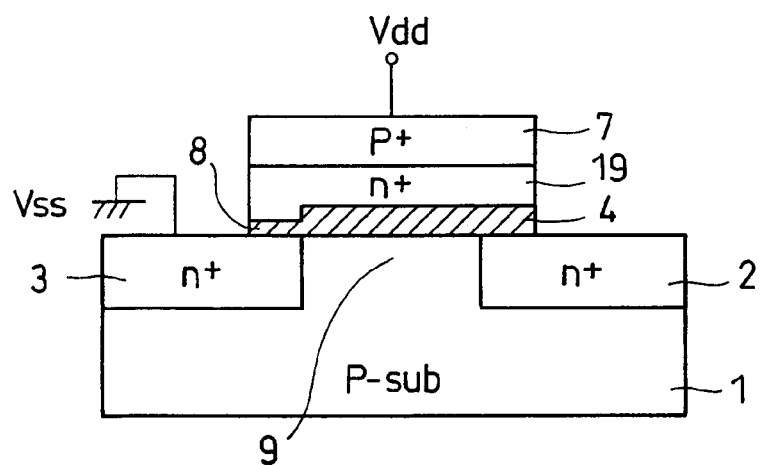
FIGS. 23–26 are sectional views of semiconductor devices in accordance with a seventh through tenth aspect of the present invention, respectively.

A semiconductor device in accordance with a seventh aspect of the present invention is shown in cross-section in FIG. 23. This device is similar to that of FIG. 21, but does not include the interlayer tunnel dielectric layer 6. The layer deletion causes the n+-type first conductive layer 19 and the p+-type second conductive layer 7 to be in direct contact with each other. This results in forming an Esaki diode for use as the negative differential resistance.

With this example, the tunnel dielectric film is not interposed at the interface of the pn junction of the Esaki diode. This permits omission of the oxidation process for fabricating the tunnel dielectric film 6 of the semiconductor device of the sixth aspect, which reduces manufacturing costs. However, certain techniques are required for controlling diffusion of impurities doped. One example of the impurity diffusion control techniques is to optimize the process conditions during the regrowth of polysilicon of the second conductive layer 7 to thereby suppress mutual out-diffusion of the doped impurities.

Obviously, the device of FIG. 23 may also be used to form the SRAM shown in FIG. 5, 6 or 7.

Figure 24:
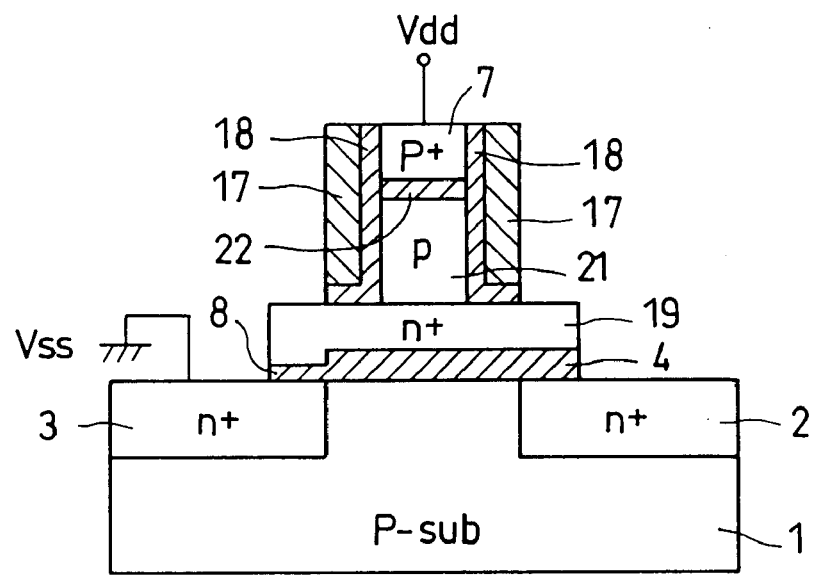

A semiconductor device in accordance with an eighth aspect of the present invention is shown in cross-section in FIG. 24. In this example, the gate section includes a stack of a semiconductor layer 21 and a silicon oxide film 22 formed between the conductive layer 21 and the p+-type second conductive layer 7. The semiconductor layer 21 is formed of a lightly-doped p (p−) type polysilicon film. A control gate 17 is formed on the sidewall of the gate section with a silicon oxide film 18 interposed therebetween. Further, the control gate 17 is made of a heavily-doped n (n+) type polysilicon. With such an arrangement, a vertical-type three-terminal surface junction tunnel transistor is formed, which in turn forms the negative differential resistance required.

The remaining parts in the device of FIG. 24 are the same as those of the sixth aspect, and accordingly an explanation thereof is omitted.

An advantage of this example is the ability to adequately adjust by the control gate 17 a current flowing in the three-terminal surface junction tunnel transistor. In other words, this example advantageously offers enhanced bistable circuit operation controllability, which is a novel concept of the present invention. This in turn makes it possible to achieve increased memory function tunabilities.

Figure 25:
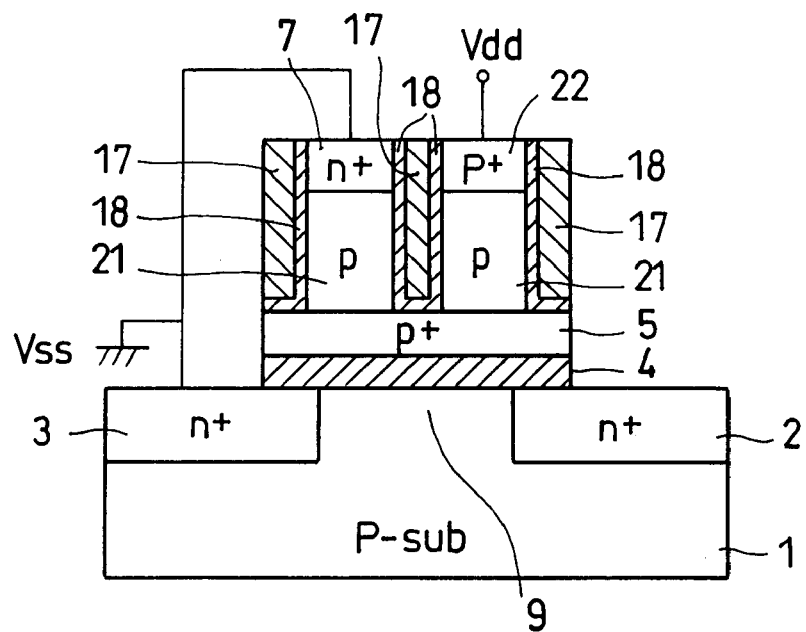

Obviously, the device of FIG. 25 may also be used to form the SRAM shown in FIG. 5, 6 or 7.

Further, it should be noted that in this structure, the aforesaid three-terminal surface junction tunnel transistor is used as the load. Optionally, the source region 3 may be modified to have a $p^+$-type conductivity for forming an Esaki diode with a multilayer structure having the $p^+$-type source region 3 and the n+-type conductive layer 19 with the tunnel dielectric film 8 laid therebetween. At this time, the drain region 2 is also designed to have a $p^+$ type conductivity. Further, respective p and n conductivity types are interchangeable with each other.

Turning now to FIG. 25, which illustrates in cross-section a semiconductor device in accordance with a ninth aspect of the present invention.

The device shown in FIG. 25 includes a p-type semiconductor substrate 1 made of silicon. Also shown are the spaced-apart n+-type source region 3 and drain region 2 in a top surface of the substrate 1, with a channel region 9 defined therebetween. A first conductive layer 5 is insulatively formed over the channel region 9 with a gate insulation film 4 sandwiched therebetween. The first conductive layer 5 is made of a $p^+$-type polysilicon, and the gate insulation film 4 is made of silicon oxide. A second conductive layer 7 and third conductive layer 22 are formed over the first conductive layer 5. The second conductive layer 7 is made of a n+-type polysilicon, and the third conductive layer 22 is made of a $p^+$ type polysilicon.

Further, a semiconductor layer 21 made of a p-type polysilicon is interposed between the first conductive layer 5 and the second conductive layer 7. The layers 21, 7 have a control gate 17 formed on sidewalls thereof with a gate insulation film 18 laid therebetween. The control gate 17 is made of an n-type polysilicon, whereas the film 18 is made of silicon oxide. With these components, a vertical-type three-terminal surface junction tunnel transistor is formed for use as the negative differential resistance.

As shown in FIG. 25, another semiconductor layer 21 made of a p-type polysilicon is formed between the first and third conductive layers 5, 22. The p-type layer 21 and the $p^+$-type layer 22 have an n-type polysilicon control gate 17 formed on their sidewalls via a gate insulation film 18 made of silicon oxide. These components form a MOS transistor for use as the load required.

The low-voltage power supply Vss of the illustrative device is useable in common for the source region 3 and the second conductive layer 7. Further, the third conductive layer 22 is connected to the high-voltage power supply Vdd. In addition, simultaneous multilayer fabrication of both the negative differential resistance and the load at the gate unit in this way will also be effective. Further, with the device of FIG. 25, similar effects and advantages to those of the first five aspects are also attainable.

Figure 26:
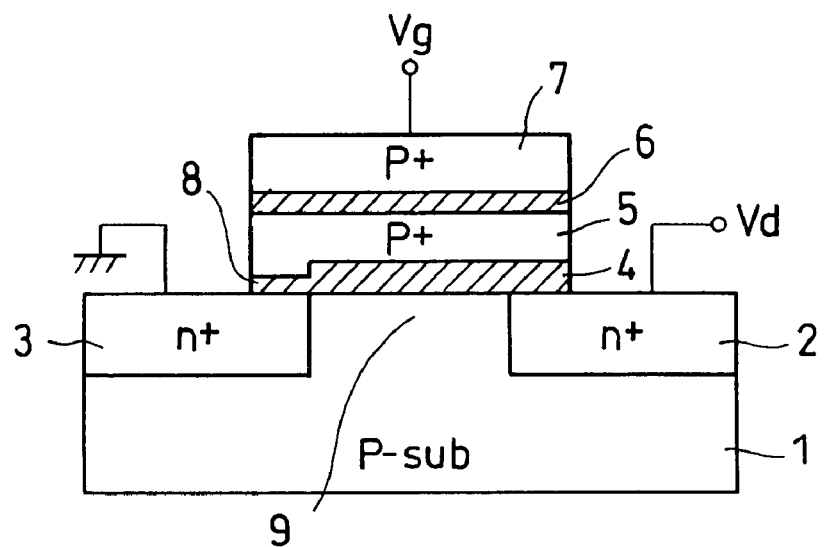

A semiconductor device in accordance with a tenth aspect of the present invention is shown in cross-section in FIG. 26. The device shown is similar in basic structure to that shown in FIG. 1, except the voltage coupling is modified as follows. The device of FIG. 26 has its source region 3 coupled to ground and the drain region 2 connected to a drain electrode.

Further, the second conductive layer 7 is a gate electrode with a gate voltage Vg being applied thereto. Use of this device as a switching device makes it possible to achieve a new functional device.

Figure 27:
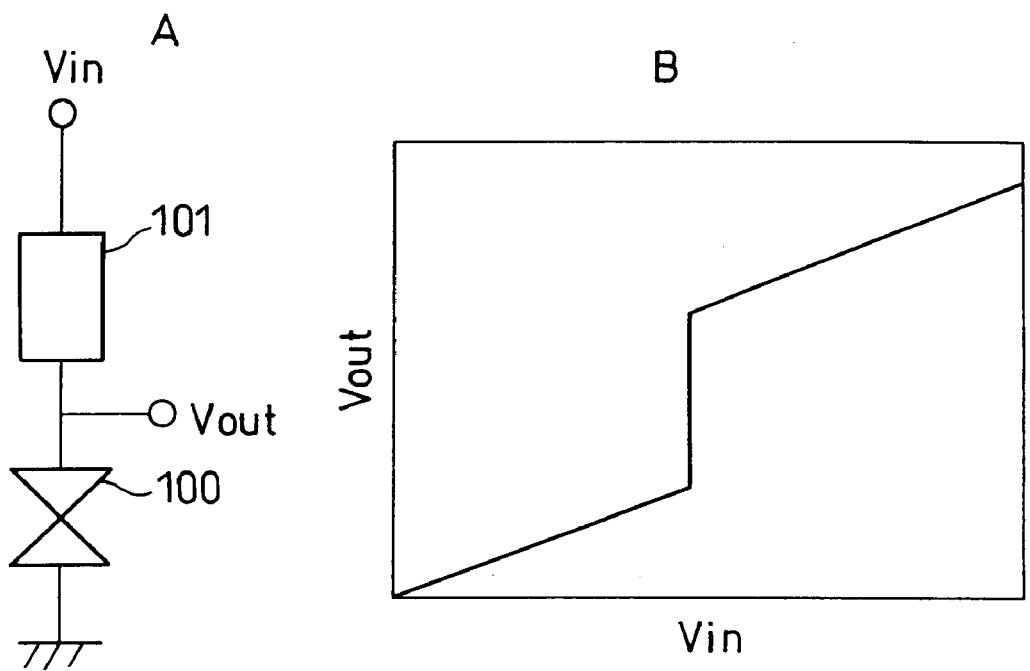

The diagram in FIG. 27A depicts equivalent circuitry of the semiconductor device shown in FIG. 26. Also, FIG. 27B graphically shows an input voltage (Vin) versus an output voltage (Vout) characteristic thereof. These diagrams are for explaining an operation of the device of FIG. 26.

As previously discussed in conjunction with FIG. 1, this semiconductor device is such that an Esaki diode is formed from the n+-type source 3 and the first conductive layer 5 made of $p^+$-type polysilicon. In addition, the tunnel dielectric layer 6 is formed between the first conductive layer 5 made of a $p^+$-type polysilicon and the second conductive layer 7 made of a $p^+$-type polysilicon, thus forming a nonlinear resistor.

The graph of FIG. 27B demonstrates a characteristic curve indicative of a change in an output voltage of the first conductive layer 5 as plotted when the second conductive layer 7 varies in an input voltage Vin. It is apparent from this graph that the presence of the negative differential resistance characteristics results in an appearance of a specific region in which first layer 5 suddenly changes in potential, namely, potentially varies rapidly or "discontinuously."

Figure 28:
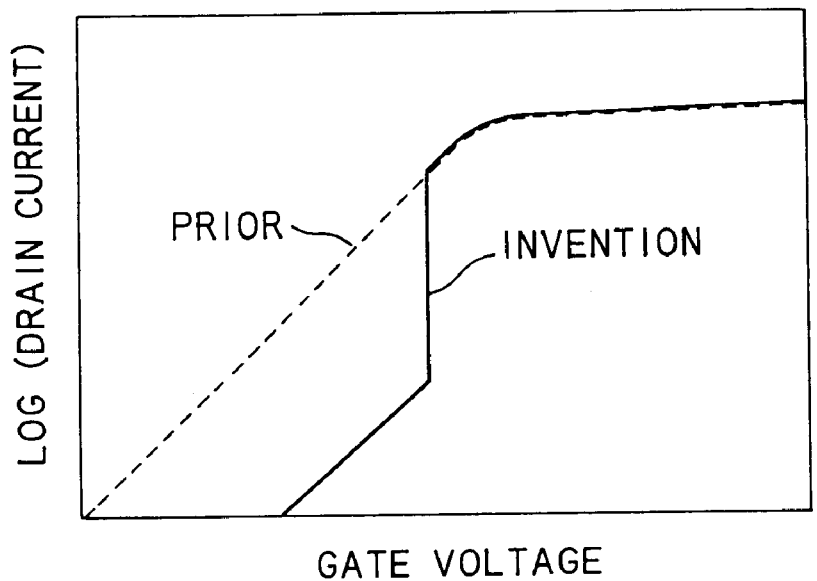
FIG. 28 graph shows the gate voltage-drain current characteristic of the semiconductor device in accordance with the tenth aspect of the present invention, for explaining an operation thereof.

The semiconductor device of FIG. 26 may perform another operation, the characteristics of which are shown in FIG. 28. In the graph of FIG. 28, a curve plotted by a solid line indicates the gate voltage versus drain current characteristic of a MOS transistor of the present invention when applying the gate voltage Vg to the second conductive layer 7. A dotted line curve shows that of background art device.

The rapid or discontinuous potential change of the first conductive layer 5 shown in FIG. 27B also results in an observation of a discontinuous change in resultant switching characteristics. In ordinary MOS transistors, a current begins to gradually flow with an increase in a gate voltage in a transit region of from the turn-off state to turn-on state. Its inclination or gradient hardly drops below a value of 60 mV/decade. This remains as a serious bar to achieving lower power consumption in presently available devices.

Fortunately, with the semiconductor device in the tenth aspect, the current rushes to flow. Thus, such transient region is made minimal or lessened. This makes it possible to reduce the effective gradient to less than 60 mV/decade. Accordingly the device will be adaptable for use as elementary IC components with an ultra-low power dissipation in the near future.

Figure 29:
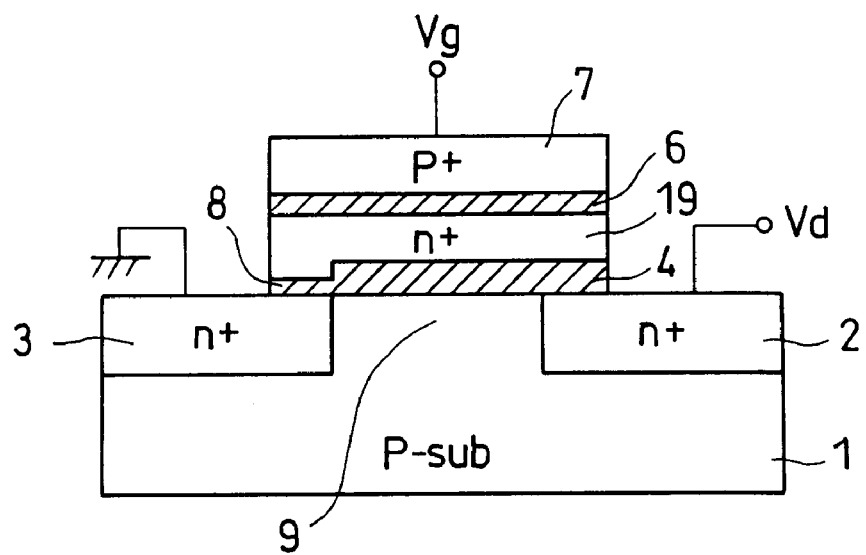
FIG. 29 is a sectional view of a semiconductor device in accordance with an eleventh aspect of the present invention.

Turning now to FIG. 29, which illustrates a semiconductor device in accordance with an eleventh aspect of the present invention. The device shown herein is similar in basic structure to that shown in FIG. 21, except the voltage connection is altered as follows. The device of FIG. 29 is such that its source region 3 is coupled to ground, and the drain region 2 is connected to a drain electrode, and the second conductive layer 7 is a gate electrode, to which a gate voltage Vg is applied. Using this device as a switching device makes it possible to achieve a new functional device.

Figure 30:
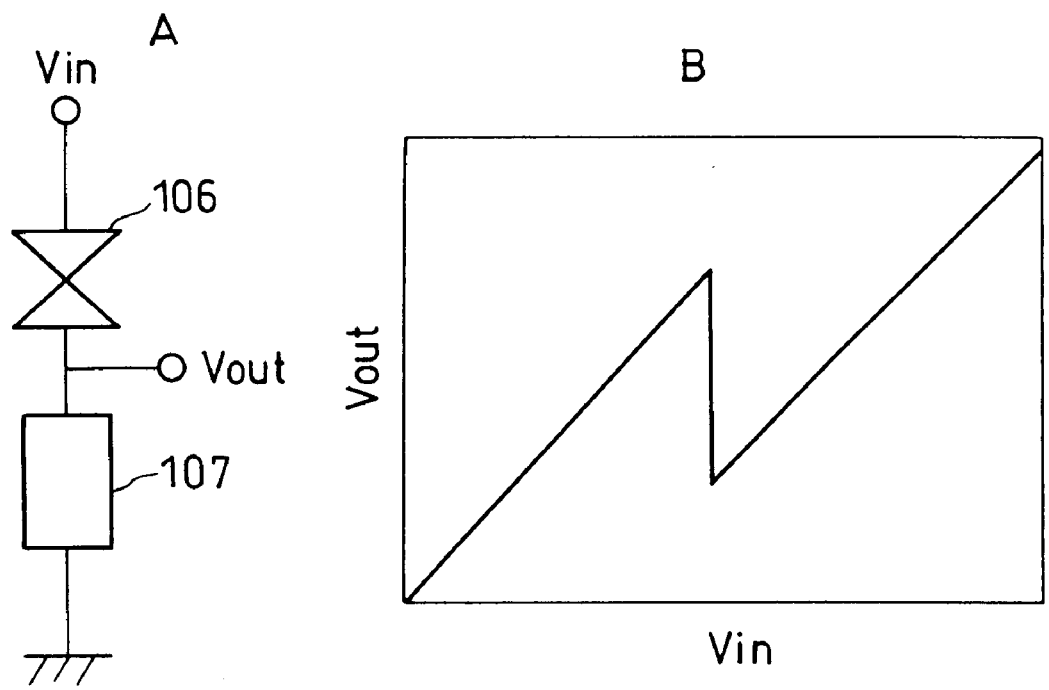

FIG. 30A schematically shows equivalent circuitry of the semiconductor device of FIG. 29 and FIG. 30B graphically shows the Vin-Vout characteristic thereof. These diagrams are for explaining an operation of the device in FIG. 29.

As already discussed in conjunction with FIG. 21, this semiconductor device is such that an Esaki diode is structured from the n+-type polysilicon first conductive layer 19 and the $p^+$-type polysilicon second conductive layer 7.

Additionally, a nonlinear resistor is formed via the tunnel dielectric layer 8 between the n'-type source region 3 and the n+-type polysilicon layer 19.

The graph of FIG. 30B shows a characteristic curve indicative of a change in an output voltage Vout of the first conductive layer 19 as plotted when the second conductive layer 7 varies in an input voltage Vin. As apparent from this graph, the presence of the negative differential resistance characteristics results in an appearance of a specific region in which the first layer potentially changes discontinuously.

Figure 31:
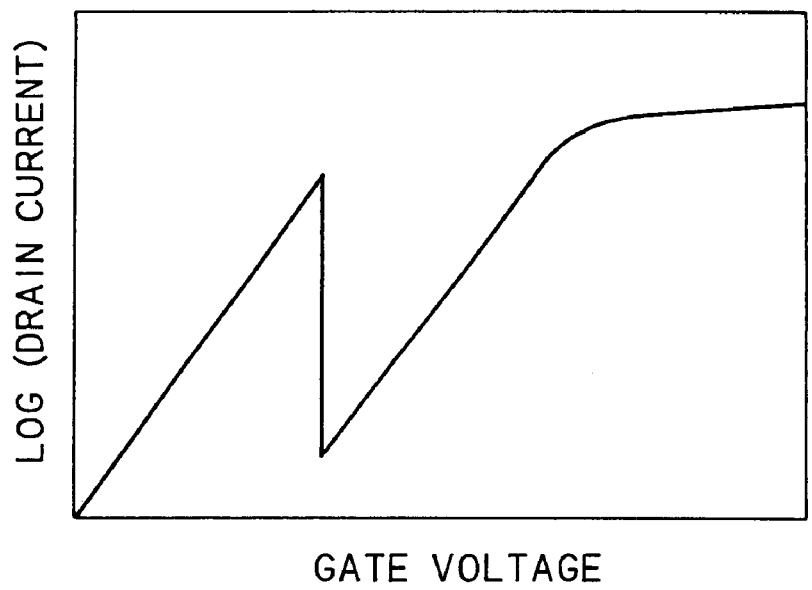
FIG. 31 is a graph showing a gate voltage-drain current characteristic of the semiconductor device in accordance with the eleventh example of the present invention, for explaining an operation thereof.

Turning now to FIG. 31, which is a characteristic diagram for explaining an operation of the semiconductor device shown in FIG. 29. The graph of FIG. 31 shows the gate voltage-drain current characteristic of a MOS transistor upon application of a gate voltage Vg to the second conductive layer 7. The discontinuous potential change of the first conductive layer 19 as shown in FIG. 30B results in observation of a likewise discontinuous change in the resultant switching characteristics. Thus, it is possible to realize an "N"-like current-voltage curve, which is not obtainable by ordinary MOS transistors. This may expand the possibility of new functional devices employing the above feature.

Figure 32:
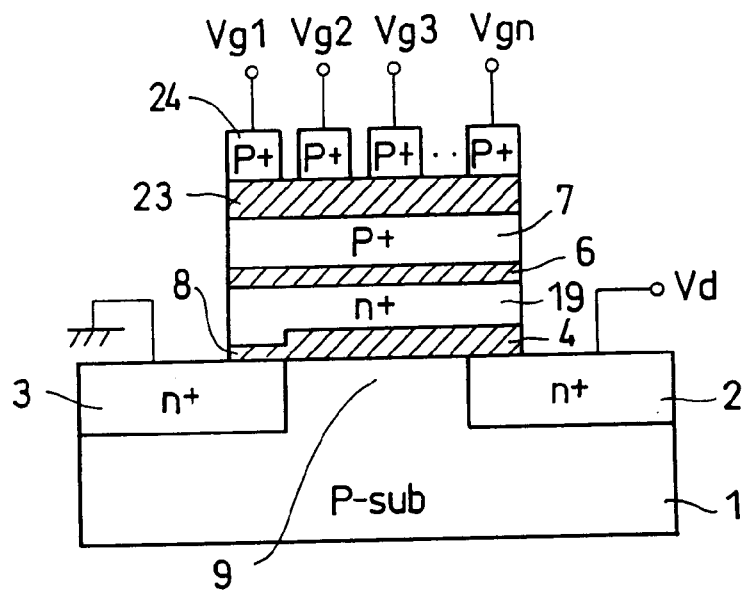
FIG. 32 is a sectional view of a semiconductor device in accordance with a twelfth aspect of the present invention.
Figure 33:
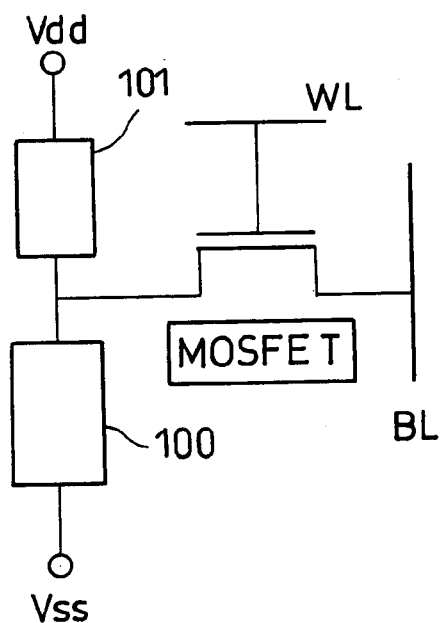
FIG. 33 is a diagram showing a configuration of equivalent circuitry of a background bistable circuit using a negative differential resistance.
Figure 34:
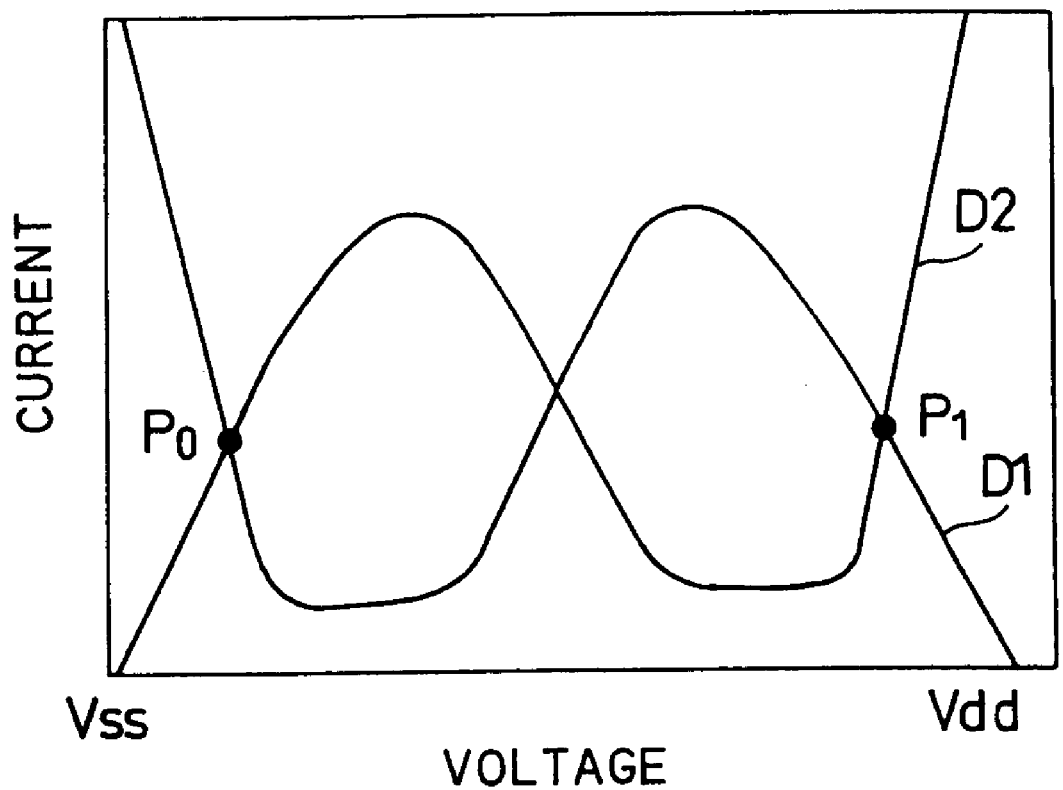
FIG. 34 is a graph showing characteristics of the background circuit of FIG. 33 for explaining an operation thereof.

A semiconductor device in accordance with a twelfth aspect of the present invention is shown in cross-section in FIG. 32. This device is similar to that shown in FIG. 29 and includes a plurality of insulated gate electrodes 24 provided over the second conductive layer 7. The gate electrodes 24 are each made of a p$^+$-type polysilicon, and are electrically isolated from the layer 7 by a gate insulation film 23 sandwiched therebetween. The film 23 is made of silicon oxide with a thickness of about 5 nm.

With this device having such a "multiple gate electrode" structure, it is possible to obtain a multiple-input/single-output functional device. It is also possible for this device to make use of analog input signals continuously variable in potential level while permitting an output signal thereof to undergo digital processing. This device is expected for application to new architectures, which are not obtainable by currently available CMOS circuitry.

Although the above-stated examples are each arranged to use the standard silicon substrate, the substrate is replaceable by a silicon-on-insulator (SOI) substrate with a silicon oxide film buried therein, when the need arises: in such a case, the same results may also be obtained. Further, the same results are obtainable when the tunnel dielectric film in each embodiment is replaced with other insulative films containing nitrogen.

In accordance with the present invention, a specific device structure is provided which is arranged to read information at a storage node through transistor amplification applied thereto and thus high-speed operability is achievable. Very importantly, such high-speed performance is obtainable while letting a current at such a storage node stay lower. Consequently, lower power consumption is accomplished simultaneously. In addition, the individual SRAM cell may be configured from a decreased number of components, merely two elements. The two-element SRAM cell is demonstrably suitable for achieving higher integration densities. Furthermore, the same is also employable as a switch element capable of realizing a new type of functional device.

Obviously, numerous modifications and variations of the present invention are possible in light of the above teachings. It is therefore to be understood that within the scope of the appended, the invention may be practiced otherwise than as specifically described herein.

What is claimed is:

1. A semiconductor device comprising:
   a semiconductor substrate;
   a gate insulation film formed on the semiconductor substrate;
   a first conductive layer formed on the gate insulation film;
   a second conductive layer formed over the first conductive layer;
   a channel region formed under the gate insulation film;
   source and drain regions formed in said semiconductor substrate, and being spaced apart from each other with said channel region being placed therebetween;
   a load located between the first conductive layer and the second conductive layer; and
   a negative differential resistance located between the first conductive layer and the source region.

2. The semiconductor device according to claim 1, wherein the load comprises a laminated structure of a semiconductor layer and a tunnel dielectric layer, and
   wherein the load functions as a tunnel diode with the first and second conductive layers.

3. The semiconductor device according to claim 1, wherein the load comprises a resistive layer, and
   wherein the load functions as a resistive element with the first and second conductive layer.

4. The semiconductor device according to claim 1, wherein the load comprises:
   a semiconductor layer formed between the first and second conductive layers;
   a dielectric film on a side face of the semiconductor layer; and
   a gate electrode on the dielectric film, and
   wherein the load functions as a metal insulator semiconductor (MIS) transistor with the first and the second conductive layers.

5. The semiconductor device according to claim 1, wherein the first conductive layer is a first conductivity type semiconductor layer, the second conductivity layer is a second conductivity type layer, and the load comprises a tunnel dielectric layer, and
   wherein the load functions as an Esaki diode with the first and second conductive layers.

6. The semiconductor device according to claim 1, wherein the first conductive layer is a first conductivity type semiconductor layer, the second conductivity layer is a second conductivity type layer, and the load comprises an interface between the first and second conductivity layers, and
   wherein the load functions as an Esaki diode with the first and second conductive layers.

7. The semiconductor device according to claim 1, wherein the first conductive layer is a first conductivity type semiconductor layer, and the second conductivity layer is a second conductivity type layer,
   wherein the load comprises a semiconductor layer formed between the first and second conductive layers, a tunnel dielectric layer formed on the semiconductor layer, a dielectric film formed on a side face of the semiconductor layer, and a gate electrode formed on the dielectric film, and
   wherein the load functions as a three-terminal surface junction tunnel transistor with the first and second conductive layers.

8. The semiconductor device according to claim 1, wherein the source region is a first conductivity type region, the first conductive layer is a second conductivity type layer, and the negative differential resistance comprises a tunnel dielectric layer, and wherein the negative differential resistance functions as an Esaki diode with the source region and the first conductive layer.

9. The semiconductor device according to claim 1, wherein the source region is a first conductivity type region, the first conductive layer is a second conductivity type layer, and the negative differential resistance comprises an interface between the first conductive layer and the source region, and wherein the negative differential resistance functions as an Esaki diode with the source region and the first conductive layer.

10. The semiconductor device according to claim 1, wherein the second conductive layer is connected to a high-voltage power supply, the source region is connected to a low-voltage power supply, and the drain region is connected to a transistor, and wherein the transistor connected to the drain region has a gate to which a word line is connected and a drain to which a bit line is connected.

11. The semiconductor device according to claim 1, wherein the semiconductor device is used as a switching device.

12. A semiconductor device comprising:

a semiconductor substrate;

a gate insulation film formed on the semiconductor substrate;

a first conductive layer formed on the gate insulation film;

a second conductive layer formed over the first conductive layer;

a channel region formed under the gate insulation film;

source and drain regions formed in the semiconductor substrate and being spaced apart from each other with said channel region being placed therebetween;

a negative differential resistance located between the first conductive layer and the second conductive layer; and a load located between the first conductive layer and the source region.

13. The semiconductor device according to claim 12, wherein the first conductive layer is a first conductivity type layer, the second conductive layer is a second conductivity type layer, and the negative differential resistance comprises a tunnel dielectric layer, and wherein the negative differential resistance functions as an Esaki diode with the first and second conductivity layers.

14. The semiconductor device according to claim 12, wherein the first conductive layer is a first conductivity type layer, the second conductive layer is a second conductivity type layer, and the negative differential resistance comprises an interface between the first and second conductivity layers, and wherein the negative differential resistance functions as an Esaki diode with the first and second conductivity layers.

15. The semiconductor device according to claim 12, wherein the negative differential resistance comprises a laminated structure of a semiconductor layer and a tunnel dielectric layer, and wherein the negative differential resistance functions as a tunnel diode with the first and second conductive layers.

16. The semiconductor device according to claim 12, wherein the first conductive layer is a first conductivity type layer, the second conductive layer is a second conductivity type layer, and the negative differential resistance comprises a semiconductor layer formed between the first and second conductive layer, a tunnel dielectric layer on the semiconductor layer, a dielectric film on a side face of the semiconductor layer and a gate electrode on the dielectric film, and wherein the negative differential resistance functions as a three-terminal surface junction tunnel transistor with the first and second conductive layers.

17. The semiconductor device according to claim 12, wherein the second conductive layer is connected to a high-voltage power supply, the source region is connected to a low-voltage power supply, and the drain region is connected to a transistor, and wherein the transistor connected to the drain region has a gate to which a word line is connected and a drain to which a bit line is connected.

18. The semiconductor device according to claim 12, wherein the semiconductor device is used as a switching device.

19. A semiconductor device comprising:

a semiconductor substrate;

a gate insulation film formed on the semiconductor substrate;

a first conductive layer formed on the gate insulation film;

second and third conductive layers formed over the first conductive layer;

a channel region formed under the gate insulation film;

source and drain regions formed in the semiconductor substrate and being spaced apart from each other with said channel region being placed therebetween;

a negative differential resistance located between the first conductive layer and the second conductive layer; and a load located between the first conductive layer and the third conductive layer.

20. The semiconductor device according to claim 19, wherein the source region and one of the second conductive layer and the third conductive layer are connected to a low-voltage power supply, and the other of the second conductive layer and the third conductive layer is connected to a high-voltage power supply.

* * * * *